US006652992B1

(12) United States Patent
Gunnerman

(10) Patent No.: US 6,652,992 B1
(45) Date of Patent: Nov. 25, 2003

(54) CORROSION RESISTANT ULTRASONIC HORN

(75) Inventor: Rudolf W. Gunnerman, Reno, NV (US)

(73) Assignee: SulphCo, Inc., Sparks, NV (US)

( * ) Notice: Subject to any disclaimer, the term of this patent is extended or adjusted under 35 U.S.C. 154(b) by 0 days.

(21) Appl. No.: 10/326,356

(22) Filed: Dec. 20, 2002

(51) Int. Cl.$^{7}$ .................................................. H03H 9/00

(52) U.S. Cl. .................. 428/673; 428/660; 310/323.19; 181/142; 333/277

(58) Field of Search ................................. 428/673, 660; 310/323.19; 181/142; 333/277

(56) References Cited

U.S. PATENT DOCUMENTS 3,697,222 A * 10/1972 Sierra
3,771,189 A * 11/1973 Horton et al.
4,607,185 A * 8/1986 Elbert et al.
4,920,954 A * 5/1990 Alliger et al.
4,954,246 A * 9/1990 Punwani et al.
5,820,011 A * 10/1998 Ito et al.
5,828,274 A * 10/1998 Jen et al. .................... 333/143
6,224,565 B1 * 5/2001 Cimino
6,257,510 B1 * 7/2001 Schuck
6,277,332 B1 * 8/2001 Sucholeiki
6,428,722 B1 * 8/2002 Furuya

FOREIGN PATENT DOCUMENTS

JP 64-043378 * 2/1989
JP 09-058621 * 3/1997
WO WO 02/071002 A1 * 2/2002

OTHER PUBLICATIONS

Web page, "Ultrasonic Horns & Fixtures," at URL=http://www.accusonics.com/, printed Dec. 9, 2002.*
Web page, "Sonoreactor Products," at URL=http://www.ae-at.com/sono/reactor.htm, printed Dec. 9, 2002.*
Web page, "Dependable Ultrasonic Horns and Tooling from Dukane," at URL=http://www.dukane.com/us/horns.htm, printed Dec. 9, 2002.*
Web page, "Sonics & Materials Inc." at URL=http://www-.sonicsmaterials.thomasregister.com/olc/sonicsmaterials/, printed Dec. 9, 2002.*

* cited by examiner

*Primary Examiner*—John J. Zimmerman
(74) *Attorney, Agent, or Firm*—M. Henry Heines; Townsend and Townsend and Crew LLP

(57) ABSTRACT

Ultrasonic horns of titanium are made corrosion resistant in aqueous media by the providing the horns with a silver end surface, either as a portion of the end surface or as the entire end surface.

13 Claims, 2 Drawing Sheets

CORROSION RESISTANT ULTRASONIC HORN

BACKGROUND OF THE INVENTION

1. Field of the Invention

This invention resides in the field of process equipment used in the treatment of materials in liquid media by ultrasound.

2. Description of the Prior Art

The use of ultrasound in accelerating the rates of chemical reactions is well known. Examples of publications that describe chemical uses of ultrasound are Suslick, K. S., *Science*, vol. 247, p. 1439 (1990), and Mason, T. J., *Practical Sonochemistry, A User's Guide to Applications in Chemistry and Chemical Engineering*, Ellis Norwood Publishers, West Sussex, England (1991). Of the various sonicating systems that have been developed, those known as "probe"-type systems include an ultrasonic transducer that generates ultrasonic energy and transmits that energy to an ultrasonic horn for amplification.

In use, ultrasonic horns are susceptible to wear and erosion, particularly when their use requires contact with an aqueous liquid reaction medium. Once erosion develops, the horns tend to lose their effectiveness and their efficiency in amplifying the ultrasonic energy drops. To minimize this loss, ultrasonic horns are typically made of steel, titanium alloys, or aluminum alloys. Each has its limitations, however. The high density of steel requires relatively high power to excite the horn and therefore a high input source for electric power. Aluminum and aluminum alloys are less dense, but more susceptible to stress fractures from the ultrasonic vibrations. Titanium alloys are preferred materials of construction, but are still susceptible to corrosion and loss of efficiency.

SUMMARY OF THE INVENTION

It has now been discovered that the corrosion rate and the rate of loss of energy efficiency of a titanium-based metal ultrasonic horn when used in an aqueous environment can be reduced significantly by using a silver-based metal at the exposed end of the horn. This can be accomplished either by depositing a silver-based metal on the end surface, by securing a cap of silver-based metal to the end or the end surface of the horn, or by constructing rod portion of the horn with a titanium shell and a silver-based metal core with the core exposed at the end surface. The silver-based metal will occupy either a portion of the end surface, preferably a central portion, or the entire end surface. A horn with silver-based metal at its exposed end can be used for extended periods of time with substantially no decline in its ability to amplify the ultrasonic energy produced by the transducer.

DETAILED DESCRIPTION OF THE INVENTION AND PREFERRED EMBODIMENTS

Figure 1:
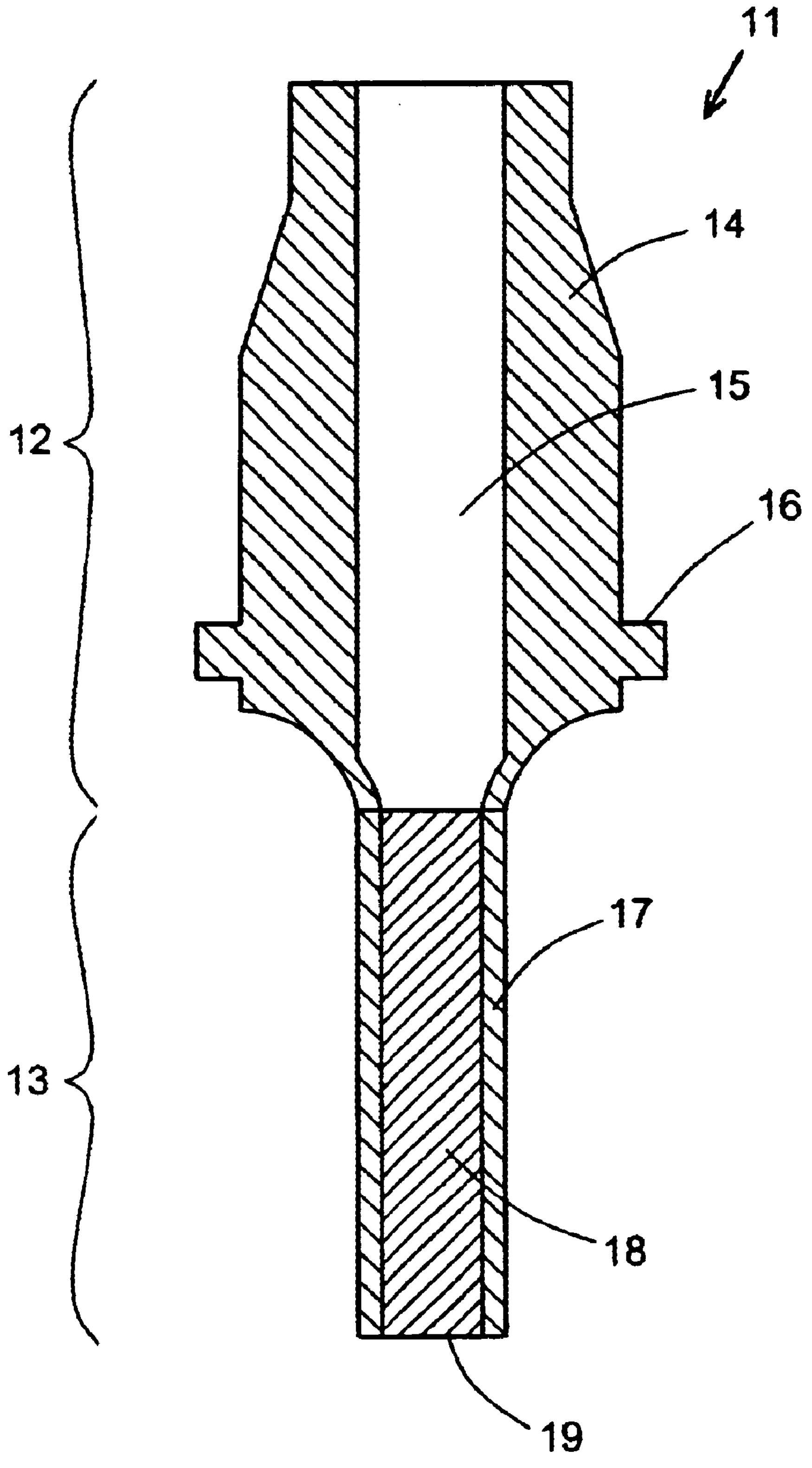
FIG. 1 is a cross section of a first example of an ultrasonic horn in accordance with the present invention.

Ultrasonic horns in accordance with this invention generally include a hollow main body terminating in a solid rod.

The hollow main body is formed of the titanium-based metal, and at least a portion of the rod is formed of the titanium-based metal as well.

The titanium-based metal can be either pure titanium or any alloy in which titanium is the major component. The titanium-based metal preferably contains at least about 85% titanium by weight, most preferably at least about 99% titanium by weight. When alloys are used, the alloying elements in most cases will include one or more of aluminum, tin, and zirconium, and optionally, in smaller quantities, oxygen, nitrogen, and carbon.

The silver-based metal used at the exposed end of the rod, or in some embodiments of the invention, as the core of the rod, can be either pure silver or any alloy in which silver is the major component. The silver-based metal preferably contains at least about 85% silver by weight, most preferably at least about 99% silver by weight. When alloys are used, the alloying elements will in most cases include copper, zinc, or cadmium, or two or more of these in combination.

The rod preferably has no external coating covering either the shell or the exposed end of the core, other than the titanium-based and the silver-based metals.

The dimensions of the components of the horn, i.e., the hollow main body and the rod, are not critical, and will be selected to achieve the desired ultrasonic energy transmission and performance and to accommodate the reaction vessel in which the ultrasonic energy is directed. In preferred embodiments of the invention, the rod is a cylinder of circular cross section, and more preferably, both the hollow main body and the rod are cylinders of circular cross section.

In certain embodiments of this invention, the rod consists of a core of the silver-based metal and a shell of the titanium-based metal. In these embodiments, the wall thickness of the shell is preferably from about 0.5 cm to about 1.0 cm, with an outer diameter of from about 1.5 cm to about 2.5 cm. A currently preferred rod of this configuration is one having a length of 2.25 inches (5.7 cm), an outer diameter of 0.5 inch (1.3 cm), with a shell having a wall thickness of 0.0625 inch (0.16 cm). The hollow main body in this embodiment has a length of 3.0 inches (7.6 cm), an outer diameter of 1.5 inches (3.8 cm), and a wall thickness of 0.5 inch (1.3 cm). An alternative is a main body and rod combination with a length of 8.0 inches (20.3 cm) and a rod outer diameter of 0.75 inch (1.9 cm).

In other embodiments of this invention, the rod consists of a solid titanium-based metal in which a hole has been drilled through the exposed end and threaded, and a screw of the silver-based metal with matching threads is inserted in the hole, the head of the screw having a width substantially equal to the width of the rod, thereby capping the entire exposed end. In these embodiments, the diameter of the screw head is of generally the same size as the diameter of the rod, which, as noted above, is preferably from about 1.5 cm to about 2.5 cm.

Still other embodiments of the invention include ultrasonic horns in which the silver-based metal occupies only the end surface of the rod section. The silver-based metal in these embodiments can be applied by any conventional means, including the welding, soldering, or otherwise bonding of a silver-based metal disk or foil, and the coating of the end surface with the silver-based metal by methods such as electroplating or chemical deposition.

While the invention is susceptible to a variety of implementations and configurations, a detailed study of specific embodiments will provide the reader with a full understanding of the concepts of the invention and how they can be applied. Such embodiments are shown in the Figures.

A cross section of one example of an ultrasonic horn in accordance with this invention appears in FIG. 1. The horn 11 is a body of revolution, and the drawing is a longitudinal cross section along the axis of the horn. The horn consists of a hollow main body 12 terminating in a rod 13, the rod having a smaller outer diameter than the hollow main body. The main body has a wall 14 of solid titanium surrounding a cavity 15 that is coaxial with the main body. A flange 16 encircling the exterior of the main body can serve as a mounting aid. The rod 13 is a titanium shell 17 filled by a silver core 18. The exposed end 19 of the rod exposes the core 18. Without the silver core 18, corrosion typically occurs at the end of the rod, and the silver core reduces this corrosion.

Figure 2:
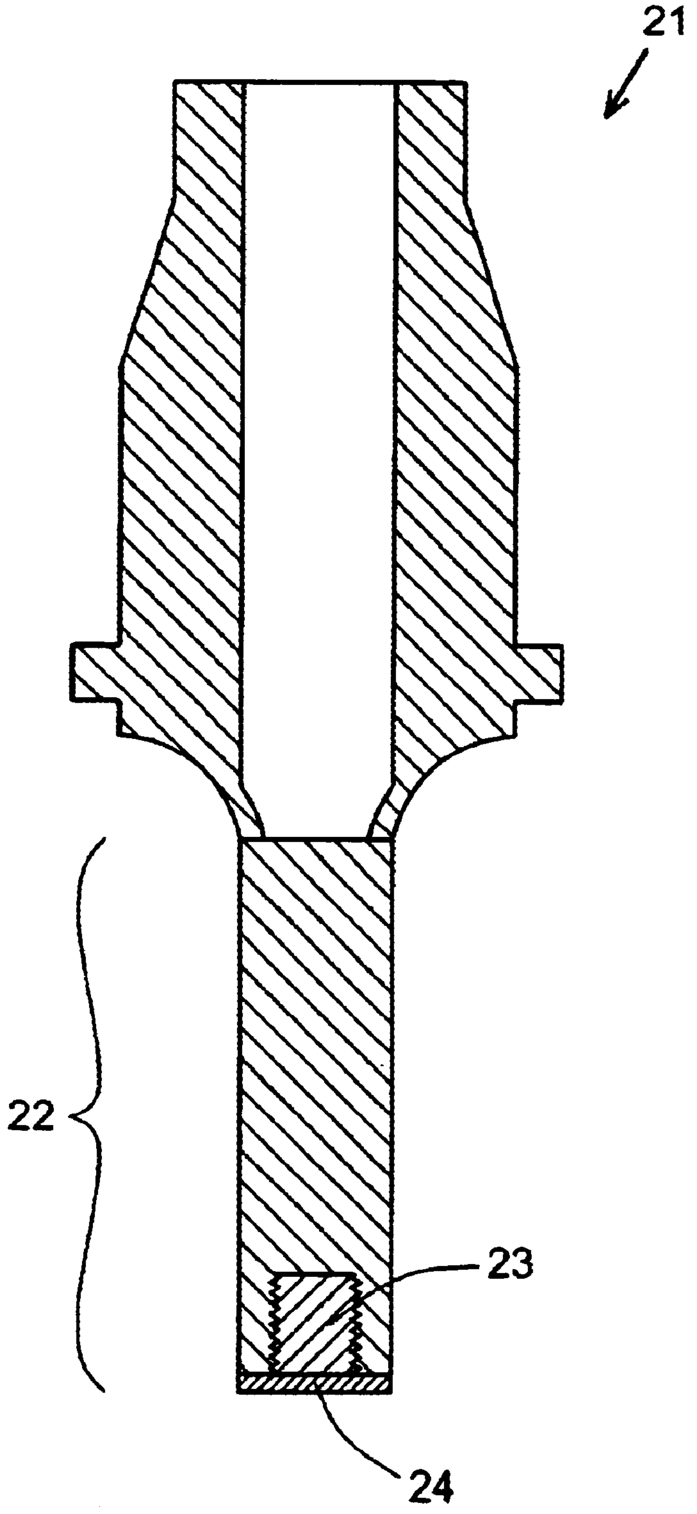
FIG. 2 is a cross section of a second example of an ultrasonic horn in accordance with the present invention.

A cross section of a second example appears in FIG. 2. This horn 21 is a body of revolution similar to that of the horn shown in FIG. 1, with the same dimensions. The rod 22 in this example is a solid titanium rod in whose end a hole has been drilled and tapped, and a silver screw 23 has been inserted in the tapped hole. The head 24 of the screw covers the entire end of the rod.

Ultrasonic horns in accordance with this invention can be used to produce soundlike waves whose frequency is above the range of normal human hearing, i.e., above 20 kHz (20,000 cycles per second). Ultrasonic energy with frequencies as high as 10 gigahertz (10,000,000,000 cycles per second) has been generated, but ultrasonic horns of the present invention are preferably operated at frequencies within the range of from about 20 kHz to about 200 kHz, and preferably within the range of from about 20 kHz to about 50 kHz. Ultrasonic waves can be generated from mechanical, electrical, electromagnetic, or thermal energy sources. The intensity of the sonic energy may also vary widely. For the purposes of this invention, best results will generally be achieved with an intensity ranging from about 30 watts/cm$^2$ to about 300 watts/cm$^2$, or preferably from about 50 watts/cm$^2$ to about 100 watts/cm$^2$. The typical electromagnetic source is a magnetostrictive transducer which converts magnetic energy into ultrasonic energy by applying a strong alternating magnetic field to certain metals, alloys and ferrites. The typical electrical source is a piezoelectric transducer, which uses natural or synthetic single crystals (such as quartz) or ceramics (such as barium titanate or lead zirconate) and applies an alternating electrical voltage across opposite faces of the crystal or ceramic to cause an alternating expansion and contraction of crystal or ceramic at the impressed frequency.

Ultrasonic horns in accordance with this invention have wide applications in such areas as cleaning for the electronics, automotive, aircraft, and precision instruments industries, flow metering for closed systems such as coolants in nuclear power plants or for blood flow in the vascular system, materials testing, machining, soldering and welding, electronics, agriculture, oceanography, and medical imaging, as well as chemical reactions and chemical processing, particularly in aqueous media, and more particularly in aqueous liquid media, including aqueous solutions, emulsions and suspensions. Various methods of producing and applying ultrasonic energy, and commercial suppliers of ultrasound equipment, are well known among those skilled in ultrasound technology.

Descriptions of aqueous reaction media in which the ultrasonic horns of the present invention can be used effectively are found in U.S. Pat. No. 6,402,939, issued Jun. 11, 2002 (Yen et al.), and U.S. patent applications Ser. Nos. 09/812,390, filed Mar. 19, 2001 (Gunnerman) now U.S. Pat. No. 6,500,219, and Ser. No. 10/279,218, filed Oct. 23, 2002 (Gunnerman), pending. The contents of each of these documents are incorporated herein by reference in their entirety for all legal purposes to be served thereby.

The foregoing is offered primarily for purposes of illustration. Further variations in the materials, additives, operating conditions, and equipment that are still within the scope of the invention will be readily apparent to those skilled in the art.

What is claimed is:

1. An ultrasonic horn comprising a hollow body adjoined to a solid rod, said solid rod having a longitudinal axis and terminating in an end surface transverse to said axis, said hollow body and said solid rod having external surfaces of a titanium-based metal except for at least a central portion of said end surface being of a silver-based metal.

2. An ultrasonic horn in accordance with claim 1 in which said solid rod comprises a shell of said titanium-based metal and a core of said silver-based metal.

3. An ultrasonic horn in accordance with claim 1 in which said end surface is circular and comprises a central disk of said silver-based metal surrounded by a ring of said titanium-based metal, said central disk occupying at least 60% of said end surface.

4. An ultrasonic horn in accordance with claim 1 in which said end surface is circular and comprises a central disk of said silver-based metal surrounded by a ring of said titanium-based metal, said central disk occupying at least 70% of said end surface.

5. An ultrasonic horn in accordance with claim 1 in which said end surface is entirely of said silver-based metal.

6. An ultrasonic horn in accordance with claim 1 in which said solid rod is a cylinder of circular cross section.

7. An ultrasonic horn in accordance with claim 1 in which hollow body is a first cylinder of circular cross section and said solid rod is a second cylinder of circular cross section.

8. An ultrasonic horn in accordance with claim 7 in which said solid rod comprises a shell of said titanium-based metal and a core of said silver-based metal, said shell having a wall thickness of from about 0.5 cm to about 1.0 cm and an outer diameter of from about 1.5 cm to about 2.5 cm.

9. An ultrasonic horn in accordance with claim 7 in which said end surface is entirely of said silver-based metal and said solid rod has a diameter of from about 1.5 cm to about 2.5 cm.

10. An ultrasonic horn in accordance with claim 1 in which said solid rod has no external coating and consists of no materials other than said titanium-based metal and said silver-based metal.

11. An ultrasonic horn in accordance with claim 1 in which said titanium-based metal is at least about 85% titanium by weight.

12. An ultrasonic horn in accordance with claim 1 in which said titanium-based metal is at least about 85% titanium by weight and said silver-based metal is at least about 85% silver by weight.

13. An ultrasonic horn in accordance with claim 1 in which said titanium-based metal is at least about 99% titanium by weight and said silver-based metal is at least about 99% silver by weight.

* * * * *